(12) United States Patent
Zha

(10) Patent No.: US 7,724,525 B2
(45) Date of Patent: May 25, 2010

(54) HEAT SINK CLIP AND ASSEMBLY

(75) Inventor: Xin-Xiang Zha, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/261,045

(22) Filed: Oct. 30, 2008

(65) Prior Publication Data
US 2009/0262504 A1 Oct. 22, 2009

(30) Foreign Application Priority Data
Apr. 18, 2008 (CN) .................... 2008 1 0066830

(51) Int. Cl.
H05K 7/20 (2006.01)
A44B 1/04 (2006.01)
(52) U.S. Cl. ............... 361/704; 257/718; 257/719; 257/727; 165/80.3; 24/457; 24/459
(58) Field of Classification Search .............. None
See application file for complete search history.

(56) References Cited
U.S. PATENT DOCUMENTS

| | | | | |
|---|---|---|---|---|
| 7,292,442 B2 * | 11/2007 | Yu et al. | .................... | 361/704 |
| 7,391,615 B2 * | 6/2008 | Fu et al. | .................... | 361/704 |
| 7,409,751 B2 * | 8/2008 | Chen et al. | .................... | 24/455 |
| 7,467,443 B2 * | 12/2008 | Lin | .................... | 24/459 |
| 7,522,420 B2 * | 4/2009 | Yan | .................... | 361/704 |
| 7,604,041 B2 * | 10/2009 | Yu et al. | .................... | 165/80.3 |
| 7,631,402 B2 * | 12/2009 | Huang | .................... | 24/457 |
| 2005/0144764 A1 | 7/2005 | Lin | | |
| 2007/0256285 A1 * | 11/2007 | Hsu | .................... | 24/459 |

* cited by examiner

*Primary Examiner*—Boris L Chervinsky
(74) *Attorney, Agent, or Firm*—Frank R. Niranjan

(57) ABSTRACT

A clip includes a body, a moveable fastener and an actuating member. The body includes a pressing part, a flat portion and a latching leg. The movable fastener includes a connecting portion, a pivot axis connected at a top end of the connecting portion and an engaging portion. The connecting portion extends through the flat portion. The actuating member defines a guiding groove therein. The guiding groove angles outward to form a height difference along a longitudinal axis of the actuating member between a topmost end and a bottommost end thereof. The actuating member is above the flat portion and connected to the pivot axis of the moveable fastener. The actuating member is levelly moveable relative to the movable fastener so that the pivot axis can slide along the guiding groove to render the moveable fastener vertically moveable between a locked position and a released position.

15 Claims, 7 Drawing Sheets

HEAT SINK CLIP AND ASSEMBLY

BACKGROUND

1. Technical Field

The disclosure generally relates to heat dissipation, and more particularly to a heat sink assembly mounted by a clip onto an electronic package.

2. Description of Related Art

A heat sink is usually placed in thermal contact with an electronic package such as a central processing unit (CPU), and transfers heat through conduction away from the electronic package to prevent overheating thereof. The heat sink is secured to the electronic package by a clip.

A related heat sink clip, shown in US Patent Application Publication No. 2005/0144764A1, includes a pressing member, an engaging member and a handle. The pressing member includes an elongated elastic section with a bend at an end thereof. The bent end defines an engaging hole therein for engaging a jut of a base which surrounds the electronic package. A slot is defined in an opposite end of the elastic section. The engaging member at an end thereof has a joining part which is provided with a fitting hole for receiving another engaging jut of the base. The engaging member at an opposite end thereof has a protrusion which passes through the slot. The handle at an end thereof, pivotally connected with the protrusion, is provided with a cam. The handle at an opposite end thereof has a pressing part to pivot the handle relative to the engaging member and extends laterally to define an extension section.

In securing the heat sink to the base, the handle at the pressing part is depressed to pivot the handle with respect to the pivotal joint of the handle and the engaging member. The extension section provides a hook end to fasten to a lateral side of the base. The cam presses the pressing member such that the elastic section generates tensile deformation against the heat sink to secure the heat sink to the electronic package.

However, to generate a downward pressing force against the heat sink via the heat sink clip, it is necessary to press the handle downwardly with the cam pressing the pressing member to thereby secure the engaging member to the base. Pressing the handle into position requires a relatively large force, and it is not easy to mount the engaging member onto the base.

Therefore, there is a need for a heat sink clip, which can eliminate the limitations described.

SUMMARY

The disclosure provides a heat sink clip. The heat sink clip includes a body, an actuating member and a movable fastener. The body includes a pressing part defining a flat portion on one end thereof and a latching leg on an opposite end thereof. The latching leg defines an opening therein. The movable fastener includes a connecting portion, a pivot axis connected at a top end of the connecting portion and an engaging portion under the connecting portion. The engaging portion defines a retaining hole therein. The connecting portion of the movable fastener extends through the flat portion of the body. The actuating member defines a guiding groove therein. The guiding groove angles outward to form a height difference along a longitudinal axis of the actuating member between a topmost end and a bottommost end thereof. The actuating member is located above the flat portion and connected to the pivot axis of the moveable fastener. The actuating member is levelly moveable relative to the movable fastener so that movement of the pivot axis along the guiding groove renders the moveable fastener vertically moveable between a locked position and a released position.

Other advantages and novel features of the present heat sink clip will become more apparent from the following detailed description of preferred embodiments when taken in conjunction with the accompanying drawings.

DETAILED DESCRIPTION

Figure 1:
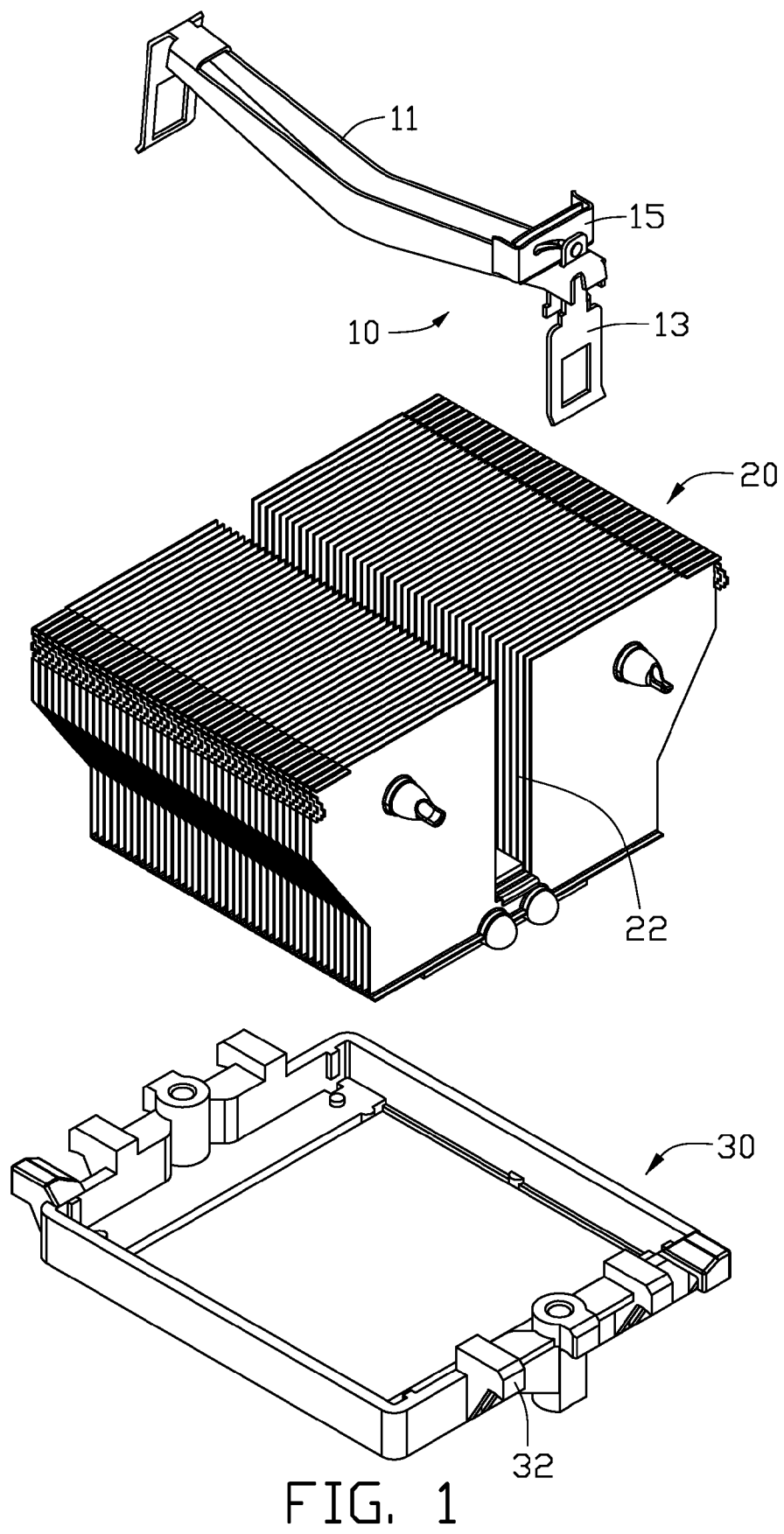
FIG. 1 is an isometric, exploded view of a heat sink assembly in accordance with a first embodiment.

Reference will now be made to the drawing figures to describe the embodiments in detail.

Referring to FIG. 1, an isometric, exploded view of a heat sink assembly in accordance with a first embodiment is illustrated. The heat sink assembly includes a heat sink clip 10, a heat sink 20 and a retention module 30. The retention module 30 is a rectangular frame providing a pair of protrusions 32 at a left side and a right side thereof. The clip 10 secures the heat sink 20 to a printed circuit board (not shown) via the retention module 30, which has been secured to the printed circuit board. The heat sink 20 defines a receiving slot 22 in a center thereof.

The clip 10 includes an elongated body 11, a movable fastener 13, and an actuating member 15.

Figure 2:
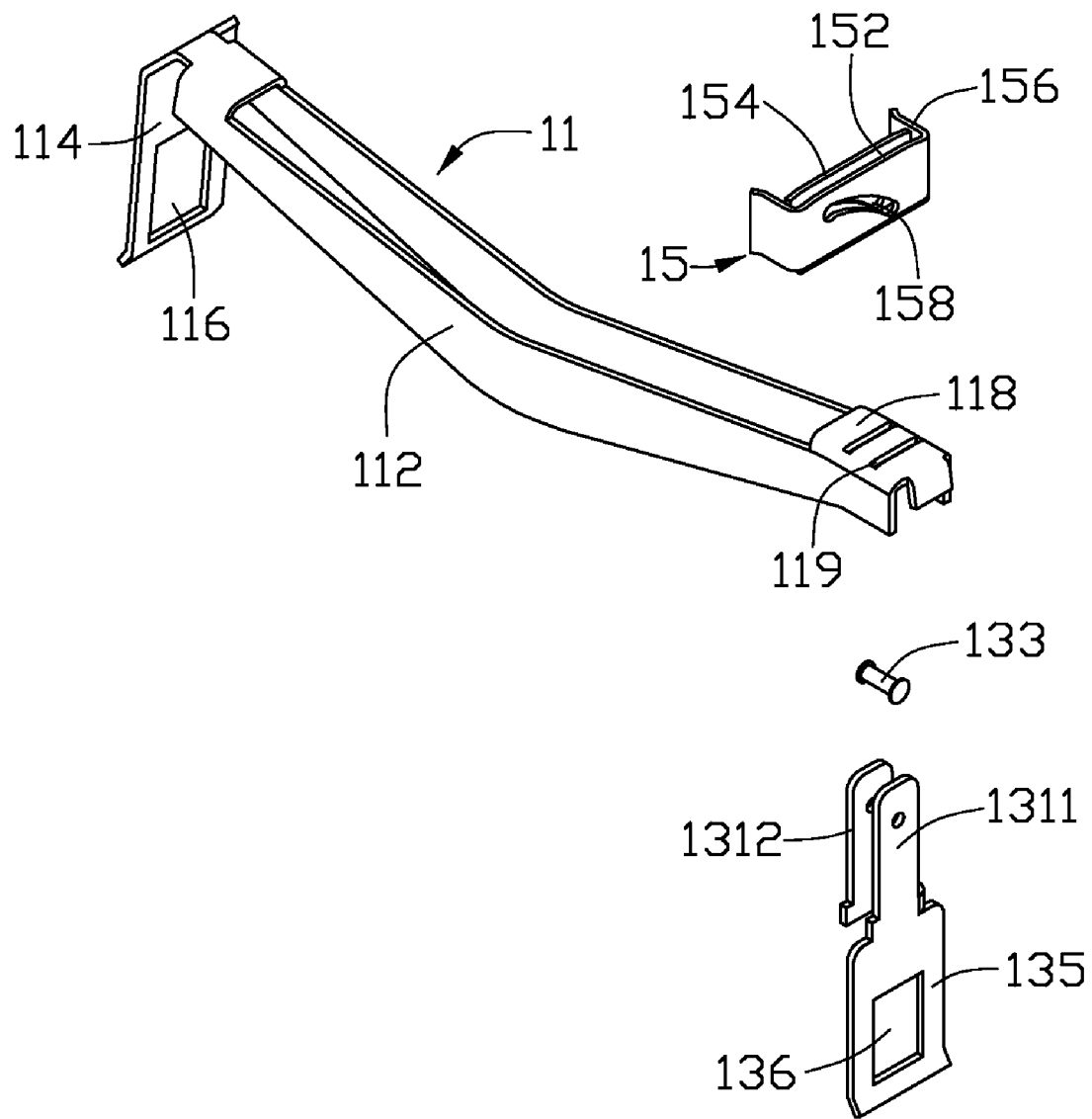
FIG. 2 is an exploded view of a heat sink clip of the heat sink assembly of FIG. 1.
Figure 3:
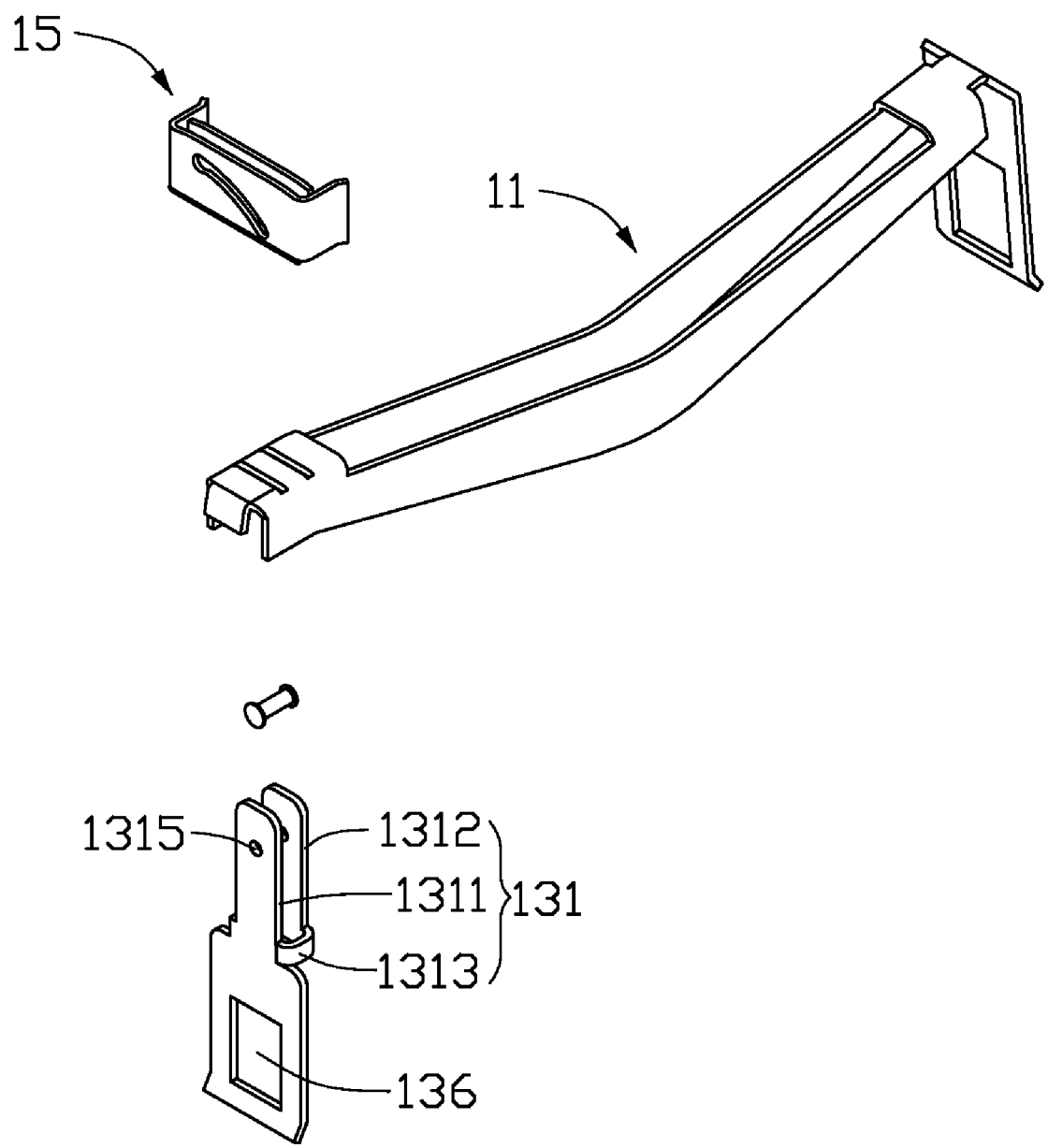
FIG. 3 is a view similar to FIG. 2, shown from a different aspect.

Referring to FIG. 2 and FIG. 3, the elongated body 11 includes an elongated pressing part 112, a latching leg 114 and a flat portion 118 formed at each end of the pressing part 112. The pressing part 112 is generally V-shaped to provide resilience. The pressing part 112 includes a pair of elongated resilient arms. An elongated groove is defined between the two arms. The flat portion 118 interconnects the two arms. The latching leg 114 extends downwardly and outwardly from one flat portion 118 at a left side of the pressing part 112, and defines an opening 116 therein to engage with one of the protrusions 32 of the retention module 30. The opening 116 is horizontally oriented. Two parallel grooves 119 are defined in the other flat portion 118 at a right side of the pressing part 112. The grooves 119 are vertically oriented and arranged in two parallel lines extending from one of the arms to the other of the pressing part 112.

The moveable fastener 13 includes a connecting portion 131 at a top end thereof, a pivot axis 133 traversing through the connecting portion 131, and an engaging portion 135 at a bottom end of the moveable fastener 13. The connecting portion 131 includes a flat first connecting arm 1311, a flat second connecting arm 1312 and a sidewall 1313 interconnected between one side of a bottom end of the first connecting arm 1311 and the second connecting arm 1312. The first connecting arm 1311 and the second connecting arm 1312 are parallel and enter the grooves 119 of the flat portion 118 at the right side of the elongated body 11, respectively. Each of the first connecting arm 1311 and the second connecting arm 1312 defines a pivot hole 1315 at a top end through which the pivot axis 133 traverses. The engaging portion 135 extends downwardly from a bottom end of the first connecting arm 1311, and defines a retaining hole 136 therein. The retaining hole 136 engagingly receives the other protrusion 32 of the retention module 30.

The actuating member 15 includes a first flat wall 152, a second flat wall 154 parallel thereto, a bottom wall 153 (see FIG. 4) interconnected between bottom sides of the first flat wall 152 and the second flat wall 154, and two edges 156 bent perpendicularly from a front side and a rear side of the first flat wall 152 towards the second flat wall 154, respectively. Each of the first flat wall 152 and the second flat wall 154 is rectangular, and defines a guiding groove 158 in a central portion thereof. The distance between the first flat wall 152 and the second flat wall 154 is less than that between the first connecting arm 1311 and the second connecting arm 1312 of the moveable fastener 13. The guiding grooves 158 are curved, and substantially angle along diagonal lines of the first flat wall 152 and the second flat wall 154, respectively.

Figure 4:
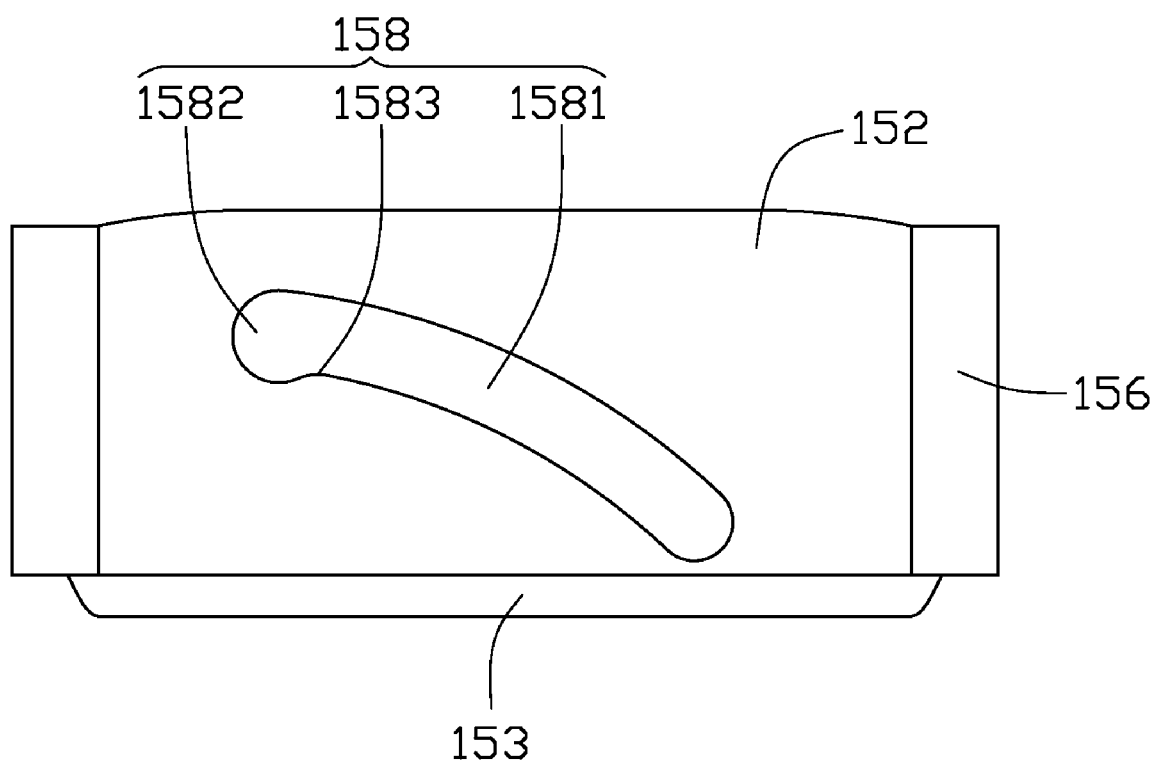
FIG. 4 is an enlarged front elevation view of an actuating member of the heat sink clip of FIG. 2.

Referring to FIG. 4, the guiding groove 158 includes a curved sliding channel 1581 and a position hole 1582 located at a tip thereof, communicating with the sliding channel 1581. The sliding channel 1581 angles smoothly from a right bottom corner of the first flat wall 152 towards a left upper corner thereof, so that a height difference along a longitudinal axis of the first flat wall 152 is formed between the tip of the sliding channel 1581 and a bottommost end of the sliding channel 1581. The tip of the sliding channel 1581 is adjacent to the left upper corner of the first flat wall 152, and the bottommost end of the sliding channel 1581 is adjacent to the right bottom corner of the first flat wall 152. The sliding channel 1581 is wider than the diameter of the pivot axis 133, thus the pivot axis 133 can slide relative to the actuating member 15 along the sliding channel 1581. A bottom border of the position hole 1582 is lower than a bottom border of the tip of the sliding channel 1581. A block portion 1583 protrudes from a bottom surface of a connecting portion between the tip of the sliding channel 1581 and the position hole 1582. The position hole 1582 has a diameter exceeding that of the pivot axis 133, thus the pivot axis 133 moving along the sliding channel 1581 can enter the position hole 1582 and finally be engaged in the position hole 1582 by limitation of the block portion 1583.

Figure 5:
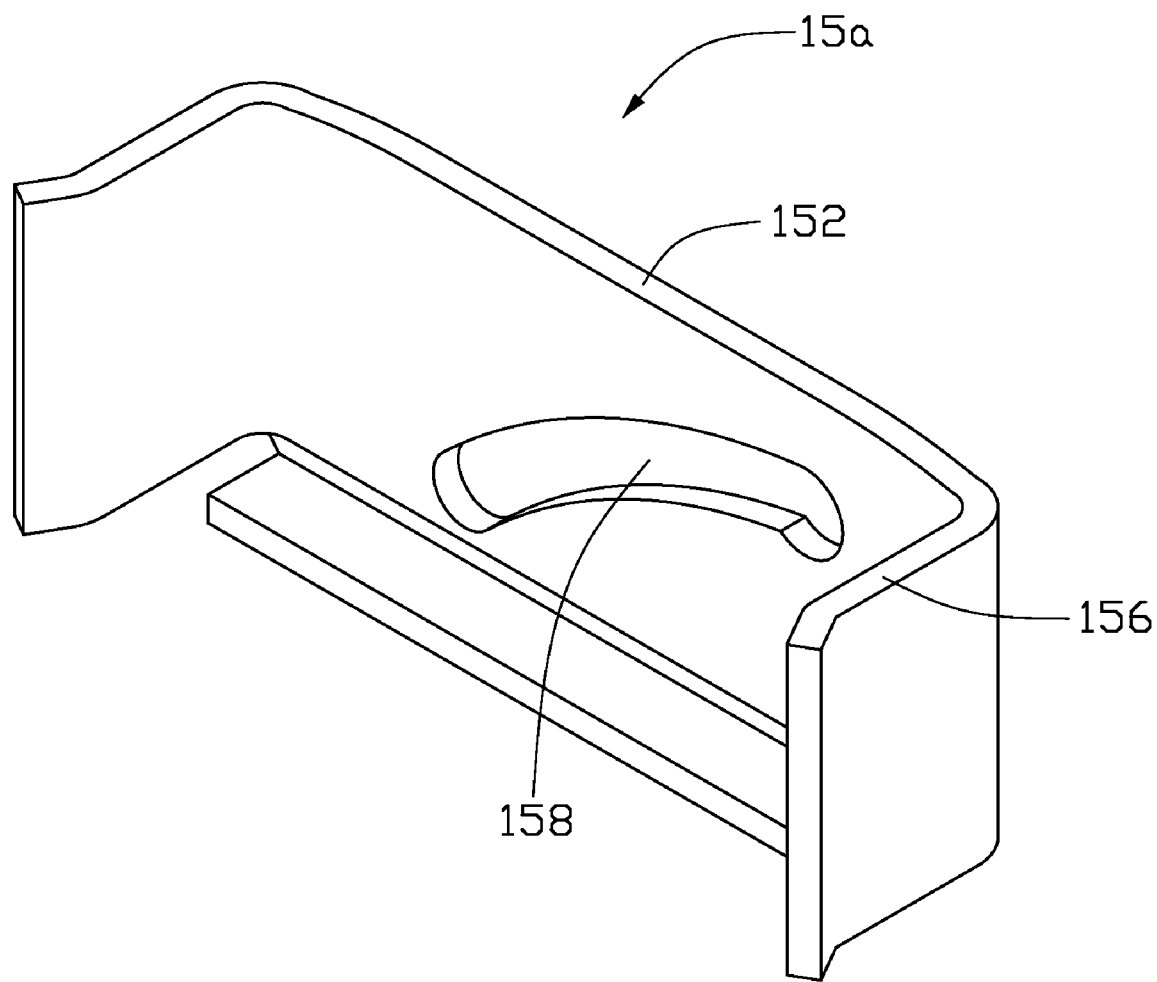
FIG. 5 is an enlarged rear isometric view of the actuating member of the heat sink clip according to a second embodiment.

Alternatively, structure of the actuating member 15 can be varied, with the sole requirement being that actuating member 15 define at least one guiding groove 158 which defines the height difference in the longitudinal direction of the first flat wall 152 between a topmost end and the bottommost end thereof. FIG. 5 illustrates an actuating member 15a in accordance with a second embodiment, differing from actuating member 15 of the first embodiment only in that the actuating member 15a does not include the second flat wall 154.

During the assembly of the clip 10, the movable fastener 13 and the elongated body 11 are first combined with the first connecting arm 1311 and the second connecting arm 1312 extending upwardly to traverse through the grooves 119 of the pressing part 112 until the pivot holes 1315 are above the right flat portion 118. The actuating member 15 is put between the first connecting arm 1311 and the second connecting arm 1312 of the movable fastener 13 with the bottom wall 153 contacting a top surface of the right flat portion 118 of the pressing part 112. The pivot axis 133 enters the pivot hole 1315 of the first connecting arm 1311, the guiding grooves 158 of the first flat wall 152 and the second flat wall 154, and the pivot hole 1315 of the second connecting arm 1312 to connect the movable fastener 13, the actuating member 15 and the body 11 together.

After the moveable fastener 13 and the actuating member 15 are assembled, pressing two ends of the pivot axis 133 to form two larger portions, each of which has a larger diameter than the pivot holes 1315 of the first connecting arm 1311 and the second connecting arm 1312, at opposite ends of the pivot axis 133, respectively. Thus the actuating member 15 can move back and forth from an unlocked position (see FIG. 6) to a locked position (see FIG. 7), moving the movable fastener 13 upwardly to engage, and downwardly to disengage the protrusion 32 of the retention module 30.

Figure 6:
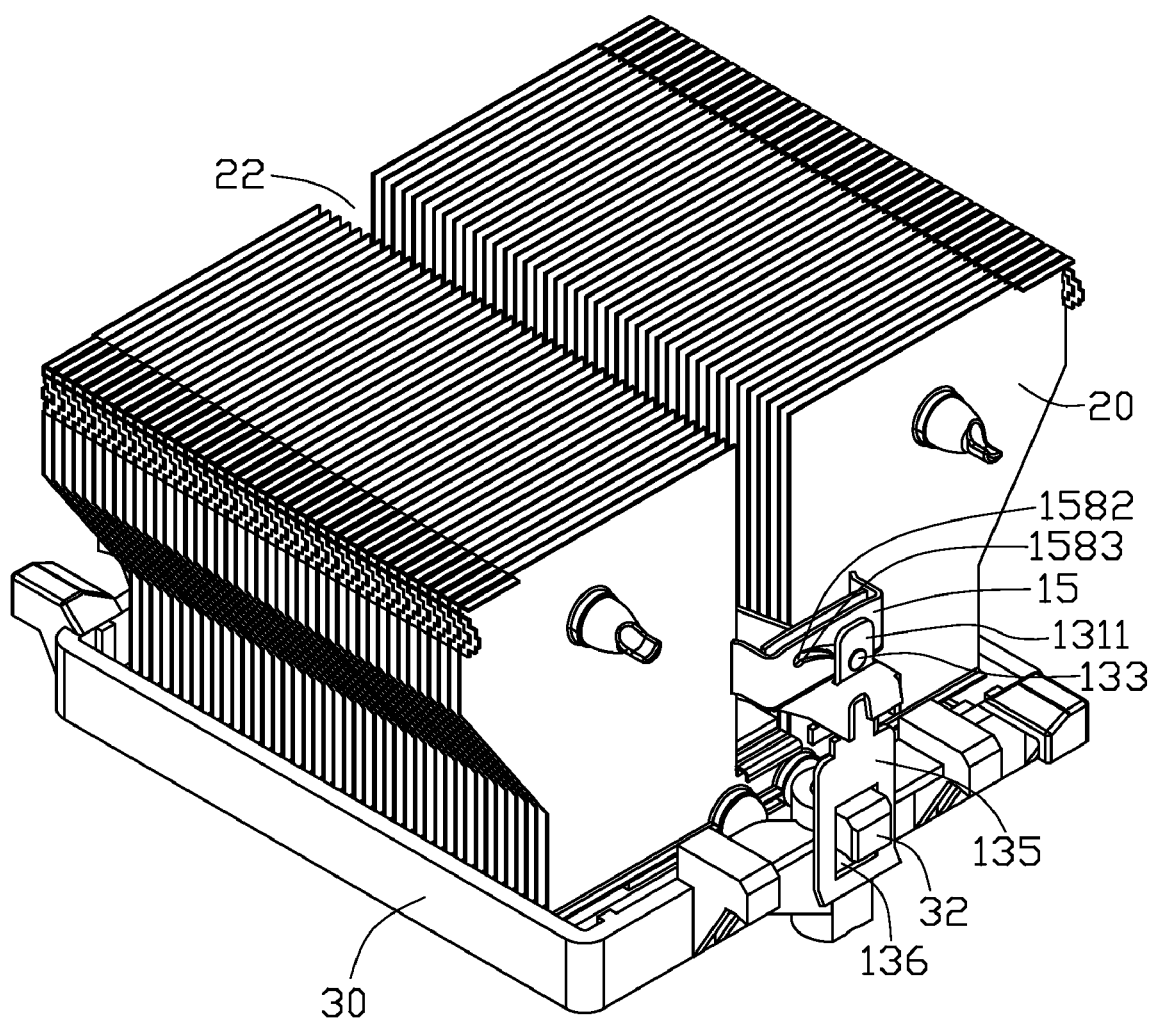
FIG. 6 is an isometric, assembled view of the heat sink assembly of FIG. 1, but with the heat sink clip in a released position.
Figure 7:
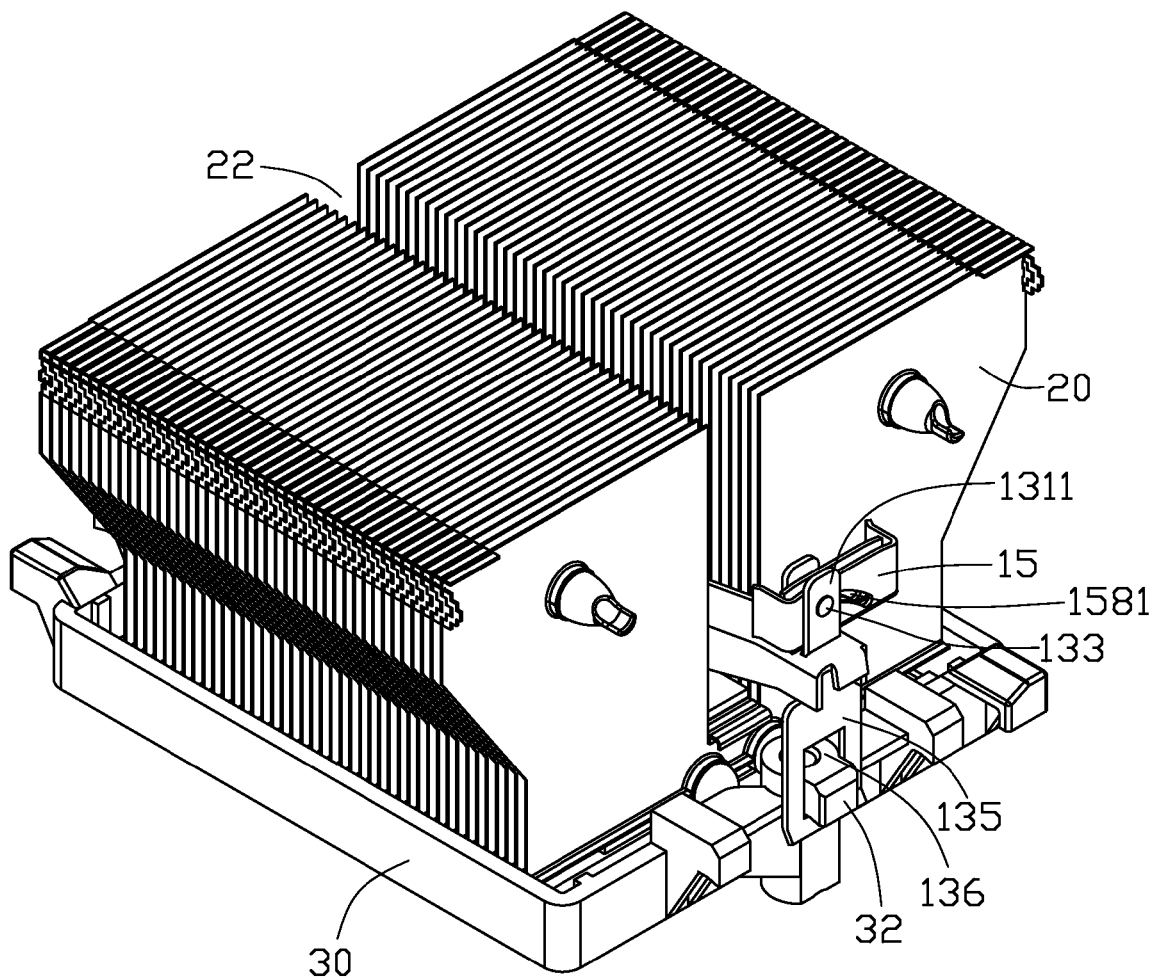
FIG. 7 is similar to FIG. 6, but with the heat sink clip shown in a locked position.

Referring to FIG. 6, in assembly of the heat sink 20 onto the retention module 30, the heat sink 20 is first placed in the retention module 30. The body 11 of the clip 10 is received in the receiving slot 22 of the heat sink 20 with the opening 116 of the latching leg 114 engaging the left protrusion 32 of the retention module 30. The pivot axis 133 is located in the bottommost ends of the guiding grooves 158 of the actuating member 15, such that the moveable fastener 13 is at a lowest position along a vertical axis of the heat dissipation device and the retaining hole 136 of the moveable fastener 13 loosely receives the right protrusion 32 of the retention module 30. The actuating member 15 is then impelled from the front side to the rear side, the pivot axis 133 slides from the right bottom corner of the actuating member 15 towards the left upper corner along the guiding channel 1581 and finally enters the position hole 1582 at the tip of the guiding channel 1581, thereby pulling the moveable fastener 13 upwardly to fasten with the right protrusion 32 of the retention module 30. Referring to FIG. 7, the pivot axis 133 is received in the position holes 1582 of the guiding grooves 158 by limitation of the block portions 1583, and the moveable fastener 13 is at its highest position. A portion of the latching leg 114 below the opening 116 and of the moveable fastener 13 below the retaining hole 136 tightly engage the protrusions 32 at the left side and the right side of the retention module 30, respectively, with the clip 10 in a self-locking state, accordingly. The actuating member 15 deforms the pressing part 112 downwardly to apply downward pressure securing the heat sink 20 to the retention module 30. A heat generating electronic package mounted on a printed circuit board and within the retention module 30 thus experiences intimate contact with the heat sink 20, with heat generated thereby absorbed and further dissipated into the surrounding environment For unlocking of clip 10, the actuating member 15 is impelled from the rear to the front, the moveable fastener 13 moves downwardly such that protrusion 32 is loosely received in the retention hole 136, and the clip 10 and the heat sink 20 are easily removable from the retention module 30. From FIG. 6, it can be clearly seen that when the clip 10 is in the unlocked position, the pivot axis 133 slides out of the position holes 1582 of the guiding grooves 158 and is received in the bottommost end of the guiding channel 1581 after sliding along the guiding channel 1581 from the left upper corner of the actuating member 15 towards the right bottom corner thereof. The moveable fastener 13 is at the lowest position again, and the engaging portion 135 of the moveable fastener 13 can disengage from the protrusion 32 of the retention module 30.

To prevent the pivot axis 133 from escaping from the position holes 1581 of the guiding grooves 158 due to improper operation or other unexpected action, the block portions 1583 preferably protrude upwardly so that the pivot axis 133 is retained in the position holes 1581 until the actuating member 15 is impelled along a level axis, sliding pivot axis 133 out of the position holes 1581 along the block portions 1583. Moreover, the moveable fastener 13 needs to move along the vertical axis of the heat sink assembly only as far as the height difference formed between the tip of the sliding channel 1581 and the bottommost end of the sliding channel 1581. Clip 10 can thus secure the heat sink 20 onto heat generating electronic packages of varying heights by only replacing the actuating member 15.

It is to be understood, however, that even though numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink clip comprising:
   a body comprising a pressing part, a flat portion on one end of the pressing part and a latching leg on an opposite end of the pressing part, the latching leg defining an opening therein;
   a movable fastener comprising a connecting portion, a pivot axis connected at a tip of the connecting portion and an engaging portion under the connecting portion, the engaging portion defining a retaining hole therein, the connecting portion of the movable fastener extending through the flat portion of the body; and
   an actuating member defining a guiding groove therein, the guiding groove angling and forming a height difference along a longitudinal axis of the actuating member between a topmost end and a bottommost end thereof, the actuating member located above the flat portion and connected to the pivot axis of the moveable fastener with the pivot axis extending through the guiding groove, the actuating member being levelly moveable relative to the movable fastener so that the pivot axis can slide along the guiding groove to move the moveable fastener vertically between a locked position and a released position.

2. The heat sink clip of claim 1, wherein the actuating member comprises a rectangular flat wall, the guiding groove being defined in the rectangular flat wall and extending along a diagonal line of the rectangular flat wall.

3. The heat sink clip of claim 2, wherein the guiding groove comprises a sliding channel angling upwardly to a position close to a top edge of the rectangular flat wall and a position hole located at a tip of the guiding channel, a block portion being formed between the guiding channel and the position hole.

4. The heat sink clip of claim 3, wherein the position hole communicates with the sliding channel, and a bottom border of the position hole is lower than a bottom border of the tip of the sliding channel.

5. The heat sink clip of claim 2, wherein the actuating member comprises two edges bent perpendicularly from two opposite sides of the rectangular flat wall, respectively.

6. The heat sink clip of claim 2, wherein the actuating member comprises an additional rectangular flat wall parallel to the rectangular flat wall, a bottom wall interconnected between bottom sides of the rectangular flat wall and the additional rectangular flat wall, and two edges bending perpendicularly from two opposite sides of the rectangular flat wall towards the additional rectangular flat wall, the additional rectangular flat wall defining an additional guiding groove therein, the additional guiding groove having the same configuration as the guiding groove of the rectangular flat wall.

7. The heat sink clip of claim 1, wherein the connecting portion of the moveable fastener comprises a first connecting arm and a second connecting arm parallel to the first connecting arm, the flat portion of the body defining two grooves through which the first connecting arm and the second connecting arm extend correspondingly.

8. The heat sink clip of claim 7, wherein the actuating member is located between the first connecting arm and the second connecting arm with a bottom side contacting a top surface of the flat portion of the body.

9. The heat sink clip of claim 7, wherein the connecting portion of the moveable fastener comprises a sidewall interconnected between one side of the first connecting arm and the second connecting arm, the engaging portion extending downwardly from a bottom end of the first connecting arm.

10. A heat sink assembly comprising:
    a retention module provided with two protrusions at two opposite sides thereof, respectively;
    a heat sink accommodated in the retention module; and
    a heat sink clip comprising:
    a body pressing the heat sink toward the retention module, the body comprising a latching leg at one end and a flat portion at an opposite end, the latching leg configured for attaching to one of the protrusions, the flat portion defining two engaging grooves therein;
    a moveable fastener comprising two connecting arms movably received in the engaging grooves correspondingly, a pivot axis traversing through a top end of the two connecting arms, and a retaining hole defined in a bottom end of the connecting arms, the retaining hole configured for attaching to the other of the protrusions; and
    an actuating member defining a guiding groove therein, the guiding groove angling and forming a height difference along a longitudinal axis of the actuating member between a topmost end and a bottommost end thereof, the actuating member located above the body and between the connecting arms of the moveable fastener, and being connected to the pivot axis of the movable fastener with the pivot axis extending through the guiding groove, wherein the actuating member is levelly moveable relative to the movable fastener so that the pivot axis sliding along the guiding groove renders the movable fastener vertically moveable between a locked position and a released position.

11. The heat sink assembly of claim 10, wherein the actuating member comprises a first flat wall in which the guiding groove is defined, the guiding groove comprising a sliding channel extending along a diagonal axis of the first flat wall and a position hole located at a tip of the sliding channel.

12. The heat sink assembly of claim 11, wherein a bottom border of the position hole is lower than a bottom border of the tip of the sliding channel, and a block portion is formed between the tip of the sliding channel and the position hole.

13. The heat sink assembly of claim 11, wherein the actuating member comprises a second flat wall parallel to the first flat wall, a bottom wall interconnected between bottom sides of the first flat wall and the second flat wall, and two edges bent perpendicularly from two opposite sides of the first flat wall towards the second flat wall, the second flat wall having the same configuration as the first flat wall.

14. The heat sink assembly of claim 10, wherein the actuating member is rectangular, the guiding groove comprises a sliding channel extending from a right bottom corner of the actuating member towards a left upper corner thereof, and a position hole located at a tip of the sliding channel, wherein when the pivot axis is located in the bottommost end of the sliding channel, the movable fastener is at the lowest position along a vertical axis of the heat dissipation device and the retaining hole of the moveable fastener can correspondingly sleeve into or out of the protrusion of the retention module.

15. The heat sink assembly of claim 14, wherein when the actuating member is impelled from the front to the rear side, the pivot axis slides from the right bottom corner of the actuating member towards the left upper corner along the guiding channel and finally enters the position hole at the tip of the guiding channel, thereby pulling the moveable fastener upwardly to fasten with the retention module.

* * * * *